United States Patent [19]

Farrell

[11] Patent Number: 4,857,801

[45] Date of Patent: Aug. 15, 1989

[54] DENSE LED MATRIX FOR HIGH RESOLUTION FULL COLOR VIDEO

[75] Inventor: James F. Farrell, Downsview, Canada

[73] Assignee: Litton Systems Canada Limited, Rexdale, Canada

[21] Appl. No.: 56,360

[22] Filed: May 28, 1987

Related U.S. Application Data

[63] Continuation of Ser. No. 486,197, Apr. 18, 1983, abandoned.

[51] Int. Cl.⁴ .................... H05B 33/02; H05B 33/10
[52] U.S. Cl. .................................... 313/500; 357/55; 437/205; 437/906
[58] Field of Search .......... 313/498, 499, 500; 357/17, 19, 32, 45, 55; 250/552, 553; 437/180, 204, 205, 906, 915

[56] References Cited

U.S. PATENT DOCUMENTS

| | | | |
|---|---|---|---|
| 3,783,353 | 1/1974 | Pankove | 313/499 X |
| 3,875,473 | 4/1975 | Lebailly | 313/499 X |
| 4,211,586 | 7/1980 | Fang et al. | 313/500 X |
| 4,394,600 | 7/1983 | Flannagan | 313/500 |

OTHER PUBLICATIONS

Sanyo Technical Disclosure, "Blue Light Emitting Diode", SLB 5410, 4 pages, 10/81.

*Primary Examiner*—Kenneth Wieder
*Attorney, Agent, or Firm*—Elliott N. Kramsky

[57] ABSTRACT

A display for full color video includes light emitting diodes (LED's) arranged to increase LED density and thereby achieve enhanced resolution. The matrix is of the type that includes a plurality of physically separate, addressable dice fixed to a substrate. The display of the invention achieves increased density by utilizing dice of at least two distinct predetermined heights which are positioned onto the substrate in a predetermined pattern whereby the heights of adjacent dice differ. In this way, the closeness of inter-die spacing is not limited by the size of a positioning tool for grasping dice adjacent their upper portions.

10 Claims, 2 Drawing Sheets

DENSE LED MATRIX FOR HIGH RESOLUTION FULL COLOR VIDEO

This application is a continuation of application Ser. No. 486,197, filed Apr. 18, 1983, now abandoned.

BACKGROUND OF THE INVENTION

The use of discrete light emitting diode arrays for graphic displays is well known. Light emitting diodes will be described herein as LEDs. An individual LED chip is called herein a "die", and a plurality of LED chips are called "dice". Each picture element of a display is called a pixel, and a pixel may include LEDs of several colors which are separately or concurrently energized. For example, a single pixel may include red and green LEDs, and it is anticipated that blue LEDs are or soon will be available to complete the combination of red, blue and green LEDs for full color displays.

The method of placing a LED chip or die onto a substrate is called "die bonding".

It is apparent that methods for die bonding LED dice may be used to position other chips.

To create a high resolution picture, the pixels must be closely spaced, and the individual LED dice must be even more closely spaced. In a monochrome picture, each pixel would have only one LED die.

The size of the dice would be expected to limit the resolution, and so it does. As expected, a larger die is more difficult to place on a short center-to-center spacing than a smaller die. However, the LEDs cannot presently be positioned without spacing therebetween, for existing positioning or die bonding tools, or collets, are larger than the LEDs, and mechanical interference between the tool and the adjacent LED dice limits the array density and the picture resolution. Clearances between LED dice were necessary to allow for the size of the positioning or die bonding tool which holds the die during the positioning of the die on a surface or substrate.

LEDs are placed by die bonding machines. The machine used by the inventor was manufactured by Foton Production Automation Inc. of Chandler, Ariz. It is a model 8030 machine, serial number A01403063 with a vacuum tool or collet for the die.

Die bonding machines are well known in the art, and are available with varying degrees of automation. In a completely manual die bonder, the operator guides the bonding tool or collet to the LED die and picks it up by means of a vacuum. The operator then positions the die at the desired location on the substrate and releases the vacuum to leave the LED die in place. In a semi-automatic die bonder the operator still performs the delicate pick-up operation, but the die is automatically bonded to a predetermined position on the substrate. A fully automatic die bonder has both automatic die pick-up and placement. The die bonding machine used by the inventor is a fully automatic "pick and place" die bonder, but this invention is not limited to only this type of machine.

A typical bonding tool, or collet, for holding a LEDs die during positioning is shaped generally, on its holding face, with a concave opening for contacting a face of a die, a centrally positioned opening within the conical volume, and a vacuum source connected through the opening to the conical volume to produce a partial vacuum within the conical volume. The partial vacuum holds the die to the tool. The tool may then be positioned by known servo means, and the die released by opening the vacuum.

It is apparent that other positioning means may be used to position the die on a surface or substrate. The invention is useful where the die is smaller than the tool so that the dice cannot be positioned to touch each other.

Typical semiconductor LEDs are produced as a wafer matrix of LEDs which require lapping to reduce their height from an initially fabricated height to a specified finished product height. After lapping is completed, the wafer is saw-cut or diced into individual LED chips or dice. In the prior art matrices, the dice are desired to be all the same height. Wafers can be furnished and used at any height over a predetermined range of heights. The individual dice are separated from the wafer and accurately positioned as discrete elements in an array.

The maximum dice density, and hence resolution, attainable using existing manufacturing techniques is on the order of fifty lines per inch. The method herein described allows line resolution of at least one hundred lines per inch.

BRIEF DESCRIPTION OF THE INVENTION

High density discrete semiconductor LED arrays are defined wherein semiconductor LED dice of various heights or profiles are used in a single array. To prevent interference between the bonding tool and previously positioned dice, the heights or profiles of adjacent dice are different. The shortest dice are placed into the array first. The next adjacent dice are sufficiently high in profile above the first dice that the bonding tool can place the higher dice without disturbing the first or lower dice. The next higher profile dice are then placed adjacent the first or second lower dice. Ever higher dice may be used until the spaces between the dice are substantially filled. The variation in height of adjacent dice in the array obviates mechanical interference of a low profile die with the bonding tool which positions a high profile die. An individual die may be obtained from an expanded wafer of substantially constant height. It is then precisely located on the substrate of the array.

Though the description of the method of construction focuses mainly on LEDs, it is understood that the construction method applies equally to any chip or die which can be produced with a number of heights.

It is, therefore, an object of this invention to provide a discrete semiconductor LED array having LED dice of varying heights.

It is also an object of this invention to provide a discrete chip array having chips of varying heights.

It is also an object of this invention to improve the method of positioning LED dice or chips to prevent interference between the bonding tool and the dice or chips.

BRIEF DESCRIPTION OF THE DRAWINGS

Other objects will become apparent from the following description, taken together with the accompanying drawings, in which.

Figure 4:
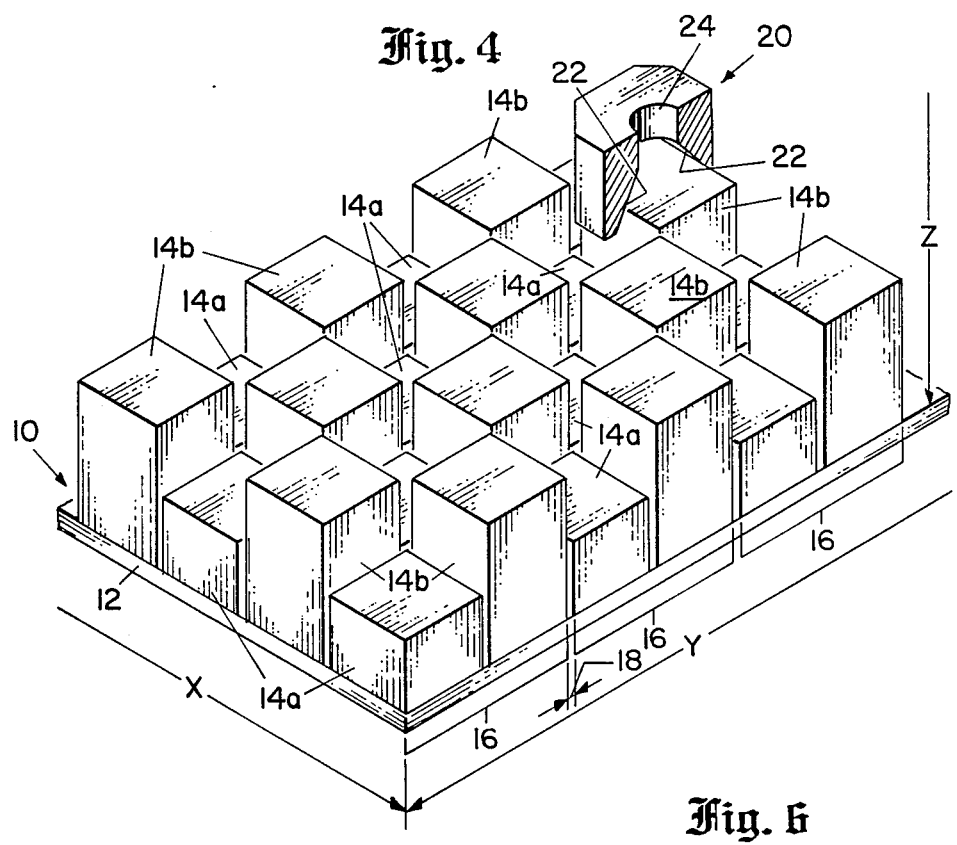
Figure 5:
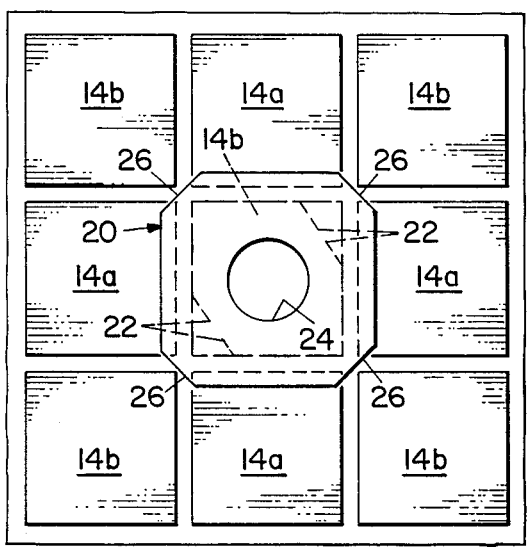
Figure 6:
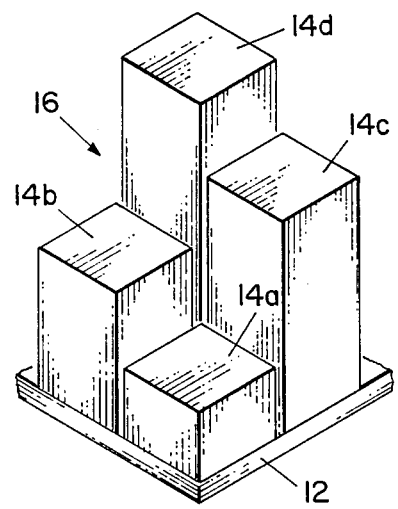

FIG. is a 4 isometric view, showing LED dice of two heights, of the completed high density discrete LED array according to the invention;

FIG. 5 is a plan view of a portion of the array of FIG. 4, illustrating the placement, according to the invention, of the LED dice of greater height adjacent the already attached shorter LED dice; and FIG. 6 is an isometric view of a portion of an array showing LED dice of four heights which optionally may be in a single pixel.

DETAILED DESCRIPTION OF THE INVENTION

Figure 1:
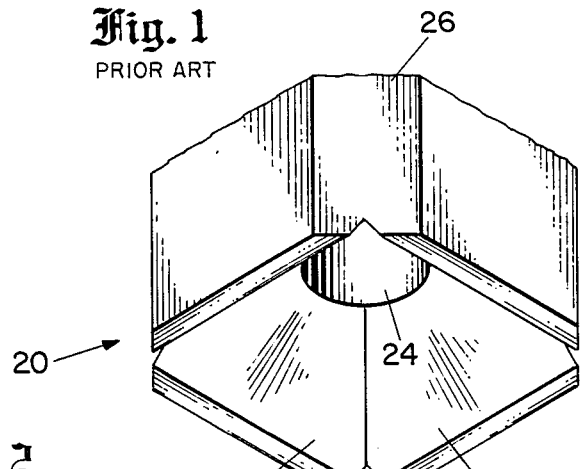
FIG. 1 is an isometric view of the face of a typical prior art pick and place a die bonding tool which accurately orients and precisely places a LED Dice.
Figure 2:
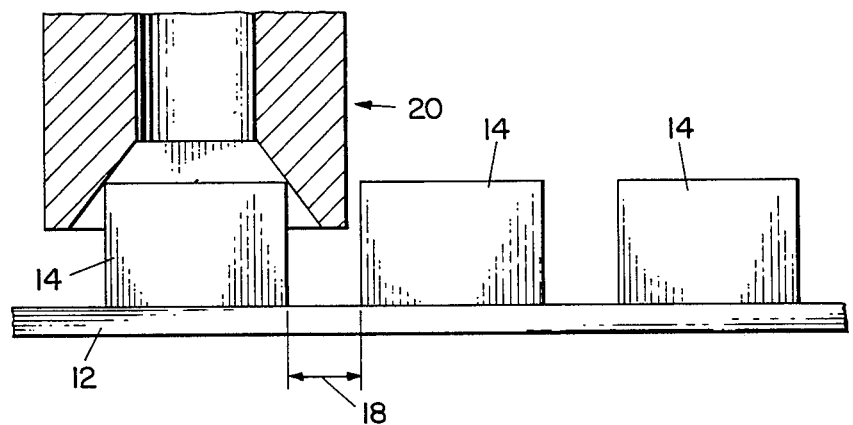
FIG. 2 is an end view of a prior art semiconductor LED array, showing the tool of FIG. 1 in section, illustrating how the bonding tool prevents close spacing between LED dice.

FIGS. 1 and 2 show the prior art. To position the dice precisely and to orient them such that their sides are parallel, a prior art die bonding tool 20 is used. The bonding tool, or collet, 20 is particularly suited to picking up and accurately placing a LED die which can be, for example, as small as 0.005 inch on a side. The construction geometry of the bonding tool 20 includes four pyramidal surfaces 22 whose apices converge to and define a tubular opening 24. The opening 24 is connected to a vacuum source (not shown) which holds the die in position against the surfaces 22, maintaining the die sides aligned with the surfaces 22. The tool 20 is positioned over a die 14, and a vacuum is drawn through the opening 24 to cause the die to adhere to the tool. The die is then delivered to the substrate 12, and release of the vacuum releases the die 14.

In FIG. 2, a plurality of dice 14 of equal height are positioned upon a substrate 12 by a bonding tool 20. Typically the tool 20 is larger than the die, whereby the dice 14 must be spaced apart to avoid interference between the tool 20 and a die that has previously been positioned.

Because the dice 14 are of equal height, the gap 18 must be sufficiently large (typically 0.005" or more) to allow the bonding tool 20 to be used.

FIG. 4 shows a finished array according to one embodiment of this invention. The individual dice are shown having two heights. The two heights are shown for convenience in explaining the invention. According to the invention, the array may have more than two heights, and three or four heights may, indeed, be optimum. For example, there could be three or four heights, as show in FIG. 6, in each pixel, at least one for each of three basic colors red, green and blue. Because the light output of the blue LEDs is much smaller than that of the red and green, it may be desirable to use two blue LEDs per pixel. Such LEDs could then be clustered in a predetermined pattern, as shown exaggerated in FIG. 6, to form one pixel of the pattern to be displayed.

In FIG. 6, typically the shortest dice 14a would be red illuminating LEDs, the next higher dice would be blue LEDs, the next higher dice would be blue LEDs, and the next higher dice would be green LEDs.

Alternatively, It would be convenient for the LEDs of each of the differently colored LEDs to be of the same height. (not shown). All of the LEDs of the same color would then be made on the same wafer and ground or polished to the same height. All dice of the same color LED could conveniently be placed on the substrate. Then the dice of the next color LED and height could be placed on the substrate. Then the dice of the following color LED and height could be placed on the substrate. Note that it is not essential to the invention, however, that all LED's of a particular color be of the same height.

In FIG. 4, a LED array 10 is comprised of a substrate 12 to which is attached a number of LED dice 14a and 14b. The means of attachment of the dices to the substrate can be any one of the standard methods commonly used in the semiconductor industry. Examples are conductive or non-conductive cement, solder or a eutectic.

The LED density in the array on the substrate can dramatically affect the resolution of a graphic display. A LED array for a multi-color display usually includes semiconductor LEDs in multiple combinations, referred to as pixels 16 (picture elements), each pixel including, typically, an LED die 14a emitting red light and a LED die 14b emitting green light. The pixel might also, for example, include other LEDs dice 14c, 14d, as shown in FIG. 6, for emitting blue light. Because of the inefficiency of blue LEDs, two blue LEDs might be used. As blue LEDs become more efficient, perhaps only one blue LED will be needed in each pixel. To attain maximum resolution of the graphic display, the matrix of pixels should be constructed to minimize the gap 18 between the dice.

In FIG. 4, the pixel 16 comprising LED dice 14a and 14b are shown distributed along the y axis of the substrate 12. The pixels 16 are shown positioned along the x axis and adjacent to each other in a pattern such that the dice 14a and 14b alternate in the x direction. The spacing of the rows and columns of pixels 16 in the matrix is usually uniform, but it is within the spirit and intent of this invention that they be non-uniform.

When three-color pixel are used, the construction method of the invention may use red, green and blue LED dice in each pixel to produce full color displays. In FIG. 6 is shown a single four-dice pixel having four dice of three different LED colors. For example, the red LED die 14a is the shortest, the next highest die is a blue LED 14c, the next highest die is a blue LED 14d, and the highest die is a green LED 14b.

In still another embodiment, (not shown) one of the blue LEDs could be omitted.

To achieve a maximum dice density, the height or "z" dimensions of the dice 14a and 14b are selected to differ with dice 14b higher than dice 14a. The dice 14a are first precisely positioned and attached to the substrate 12, as shown in FIG. 3, allowing a space therebetween for attaching the dice 14b.

As best seen in FIG. 5, the external corners 26 of the bonding tool 20 are relieved to prevent bonding tool interference, along the diagonal, with adjacent dice.

Figure 3:
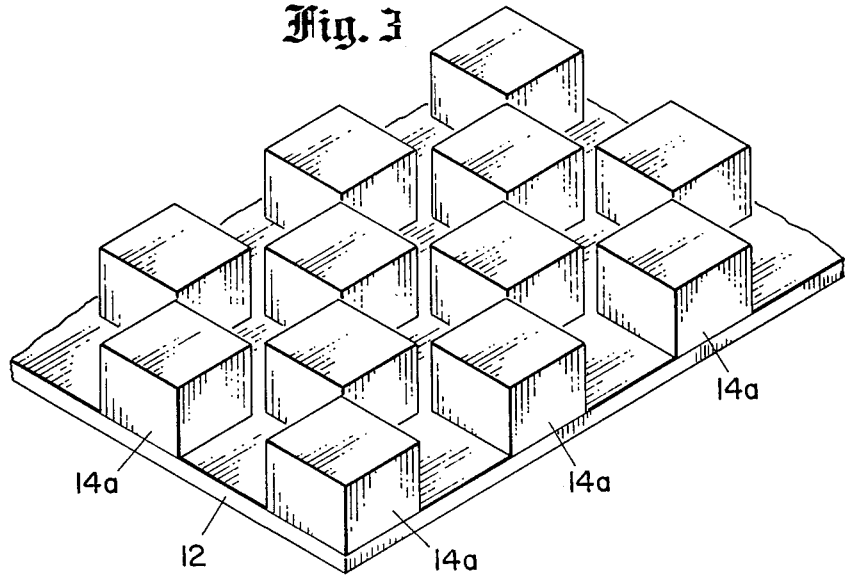
FIG. 3 is an isometric view of the array in FIG. 2 with only the shorter height semiconductor LED dice attached to the substrate.

After attaching all of the reduced height dice 14a, as shown in FIG. 3, the dice 14b are positioned therebetween allowing for the construction of the array 10 with gaps 18, typically, of 0.001 inch or less. The minimized gap 18 is attained by ensuring that the lower most extremity of the tool 20 is always higher than 14a.

It is to be stressed that the invention is not confined to the shown rectangular coordinate arrangement of dice. For example, other orthogonal arrays of dice might be circular and radial coordinates; or elliptical and hyperbolic coordinates. It is not necessary, however, that the arrangement be orthogonal. It may be completely arbitrary.

The essential feature of the invention is that the height of adjacent dice differ so that the bonding tool does not strike other dice or interfere with the placing of the LEDs.

It is apparent that semiconductor chips other than LEDs may be placed by the method of this invention, and it is intended that the invention cover such placing.

What is claimed:

1. In a LED matrix of the type that includes a plurality of physically separate, addressable dice fixed to a substrate, the improvement comprising, in combination:
   (a) individual LED dice being of at least two distinct predetermined heights; and
   b) said dice being of such heights and positioned onto said substrate in a predetermined pattern whereby the heights of adjacent dice differ so that the closeness of inter-die spacing is not limited by the size of a positioning tool for grasping dice adjacent the upper portions thereof.

2. A LED matrix as defined in claim 1 wherein the spacing between adjacent dice is less than 0.005 inch.

3. A LED matrix as defined in claim 1 further characterized in that:
   (a) each of said dice is individually addressable; and
   (b) said dice are in electrical contact with said substrate so that said dice may be addressed by means of said substrate.

4. A LED matrix as defined in claim 3 including red, blue and green emitting dice.

5. A LED matrix as defined in claim 4 wherein dice of the same emission spectrum are of equal heights.

6. A LED matrix as defined in claim 5 wherein three of said dice are arranged into a pixel including each of said emission spectra.

7. A LED matrix as defined in claim 5 wherein four of said dice are arranged into a pixel including each of said emission spectra.

8. A LED matrix as defined in claim 3 wherein said dice are fixed to said substrate by a cement.

9. A LED matrix as defined in claim 3 wherein said dice are fixed to said substrate by a solder.

10. A LED matrix as defined in claim 3 wherein said dice are fixed to said substrate by a eutectic.

* * * * *